(12) United States Patent
Ritter

(10) Patent No.: US 9,837,554 B2
(45) Date of Patent: Dec. 5, 2017

(54) DATA TRANSMISSION SYSTEM

(71) Applicant: Nexperia B.V.

(72) Inventor: Hans-Martin Ritter, Hamburg (DE)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 15/044,005

(22) Filed: Feb. 15, 2016

(65) Prior Publication Data

US 2016/0268447 A1 Sep. 15, 2016

(30) Foreign Application Priority Data

Mar. 9, 2015 (EP) .................................. 15158272

(51) Int. Cl.
| | |
|---|---|
| H01L 29/66 | (2006.01) |
| H01L 29/87 | (2006.01) |
| H01L 27/02 | (2006.01) |
| H01L 29/36 | (2006.01) |

(52) U.S. Cl.
CPC .......... H01L 29/87 (2013.01); H01L 27/0262 (2013.01); H01L 29/36 (2013.01)

(58) Field of Classification Search
CPC ....................... H01L 29/87; H01L 2924/13017
USPC ............................ 257/46, 104, 109, 121, 601
See application file for complete search history.

(56) References Cited

U.S. PATENT DOCUMENTS

| | | | | |
|---|---|---|---|---|
| 5,696,391 A | * | 12/1997 | Bernier | H01L 27/0248 257/120 |
| 5,886,339 A | * | 3/1999 | Wilson | F42C 15/44 102/206 |
| 6,501,630 B1 | | 12/2002 | Colclaser et al. | |
| 6,674,129 B1 | | 1/2004 | Colclaser et al. | |
| 6,919,587 B2 | * | 7/2005 | Ballon | H01L 29/87 257/107 |
| 7,242,607 B2 | * | 7/2007 | Kim | H01L 27/1052 365/105 |
| 7,589,359 B1 | | 9/2009 | Hwang et al. | |
| 8,704,270 B2 | | 4/2014 | Menard et al. | |
| 2003/0116779 A1 | | 6/2003 | Ballon et al. | |
| 2009/0014800 A1 | | 1/2009 | Hwang | |
| 2012/0275075 A1 | | 11/2012 | Dray et al. | |
| 2013/0200493 A1 | | 8/2013 | Sorgellos et al. | |
| 2013/0214326 A1 | | 8/2013 | Galy et al. | |

FOREIGN PATENT DOCUMENTS

| | | |
|---|---|---|
| EP | 0 655 784 A1 | 5/1995 |
| FR | 2 963 984 A1 | 2/2012 |

OTHER PUBLICATIONS

Extended European Search Report for EP Patent Appln. No. 15158272.3 (dated Aug. 19, 2015).

* cited by examiner

Primary Examiner — Tan N Tran
(74) Attorney, Agent, or Firm — Ohlandt, Greeley, Ruggiero & Perle, L.L.P.

(57) ABSTRACT

The disclosure relates to a data transmission system (100) comprising a signal line (101) and a ground line (103). A first signal path (102) is provided between the signal line (101) and the ground line (103). The first signal path (102) comprises a Shockley diode (104) having a cathode (106) and an anode (108). The cathode (106) is connected to the ground line (103) and the anode (108) is connected to the signal line (101).

7 Claims, 9 Drawing Sheets

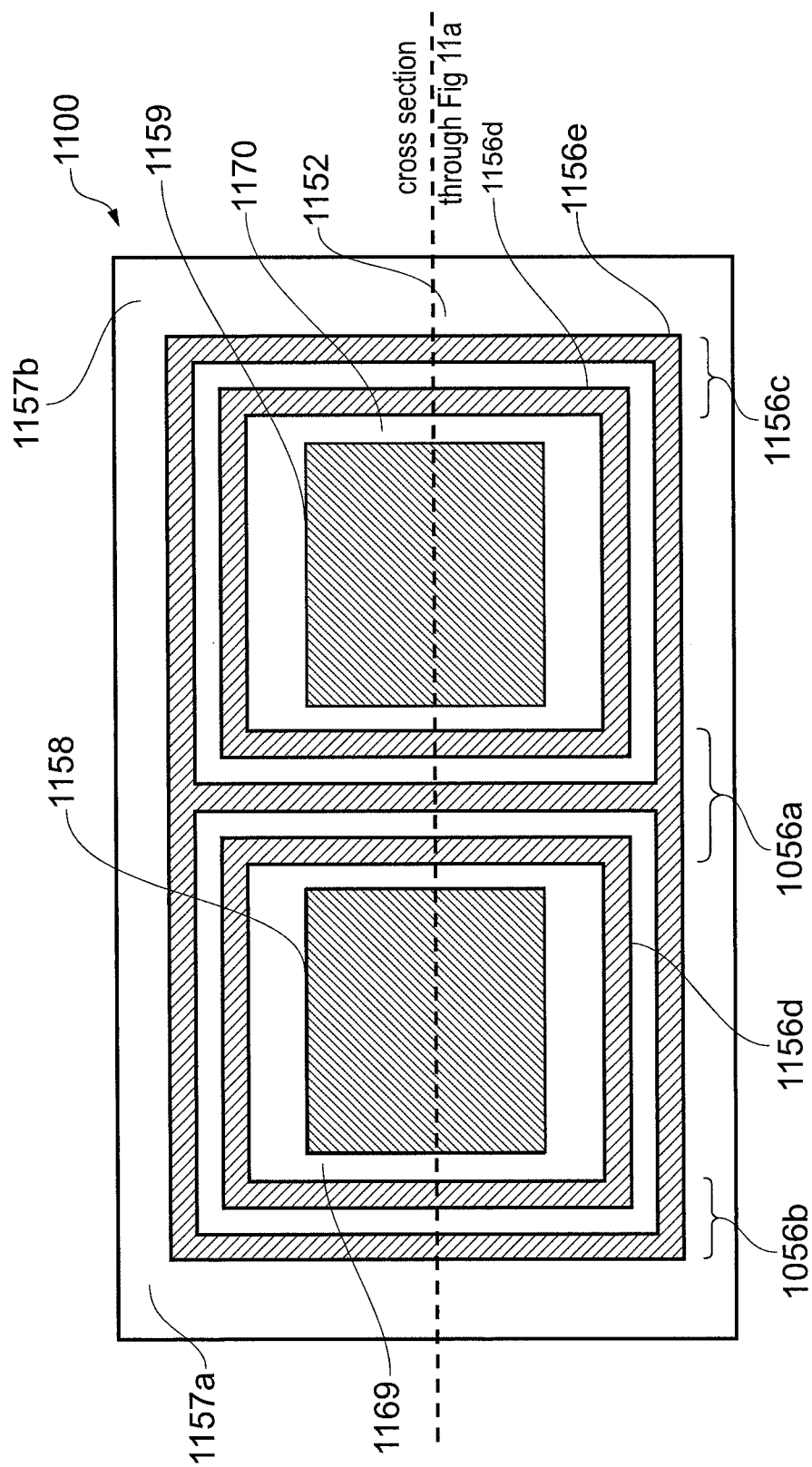

DATA TRANSMISSION SYSTEM

CROSS-REFERENCE TO RELATED APPLICATIONS

This application claims the priority under 35 U.S.C. §119 of European Patent application no. 15158272.3, filed on Mar. 9, 2015, the contents of which are incorporated by reference herein.

The present disclosure relates to a data transmission system and in particular, although not exclusively, to a data transmission system with electrostatic discharge (ESD) or electrical overstress (EOS) protection.

Electrostatic discharge is a problem encountered in a range of electronic systems, including data transmission systems. When an ESD event occurs in a data transmission system, components of the data transmission system may be damaged if the discharge is not suitably dissipated by the system.

According to a first aspect there is provided a data transmission system comprising:
  a signal line for carrying a data signal;
  a ground line for connecting to ground; and
  a first path Shockley diode having a cathode and an anode, wherein the cathode is connected to the ground line and the anode is connected to the signal line.

Implementations of such a data transmission system may provide a lower clamping voltage, a lower capacitance, and a faster turn-on than solutions that use a simple diode or thyristor placed between the signal line and the ground line, or solutions that provide a path for ESD or EOS between the signal line and a positive voltage rail.

The first path Shockley diode may have a breakdown voltage that is greater than an expected data signal voltage level on the signal line.

The data transmission system may comprise a second path diode having a cathode and an anode. The anode may be connected to the ground line. The cathode may be connected to the signal line. The second path diode may be a Shockley diode.

The first path Shockley diode may comprise an outer p-doped region, an inner n-doped region, an inner p-doped region, an outer n-doped region. The outer p-doped region and the inner n-doped region may form a first PN junction. The inner n-doped region and the inner p-doped region may form a second PN junction. The inner p-doped region and the outer n-doped region form a third PN junction.

One or more of the regions of the first path Shockley diode may comprise a first doped subregion and a second doped subregion. The first doped subregion may have a higher dopant concentration than the second doped subregion. A plurality of the regions of the first path Shockley diode may each comprise a first doped subregion and a second doped subregion. Each first doped subregion may have a higher dopant concentration than a corresponding second doped subregion of a particular region. A particular first doped subregion may have a dopant concentration that is more than 5%, 50% or 100% higher than a corresponding second doped subregion.

One or more of the PN junctions of the Shockley diode may be formed by the second doped subregions of two adjacent regions. Each of the PN junctions of the Shockley diode may be formed by the second doped subregions of two adjacent regions.

The inner p-doped region may comprise a first doped subregion, a second doped subregion and a third doped subregion. The first doped subregion may be provided between, and have a higher dopant concentration than, the second and third doped subregions of the inner p-doped region. A particular first doped subregion may have a dopant concentration that is more than 5%, 50% or 100% higher than a corresponding third doped subregion. The inner n-doped region may comprise a first doped subregion, a second doped subregion and a third doped subregion. The first doped subregion may be provided between, and have a higher dopant concentration than, the second and third doped subregions of the inner n-doped region.

The data transmission system may comprise a bypass trigger element. The bypass trigger element may comprise a first terminal connected to the first doped subregion of the inner p-doped region of the Shockley diode. The bypass trigger element may comprise a second terminal connected to the first doped subregion of the inner n-doped region of the Shockley diode. The bypass trigger element may be integrated with the first path Shockley diode.

Each first doped subregion may have a dopant concentration greater than $1 \times 10^{15}$ cm$^{-3}$. Each second doped subregion may have a dopant concentration lower than $1 \times 10^{15}$ cm$^{-3}$.

The first path Shockley diode may comprise one or more contacts. Each contact may be disposed within 4 microns of one of the PN junctions. The Shockley diode may be a vertical semiconductor device.

One or more embodiments of the disclosure will now be described, by way of example only, and with reference to the accompanying figures in which.

Figure 1:
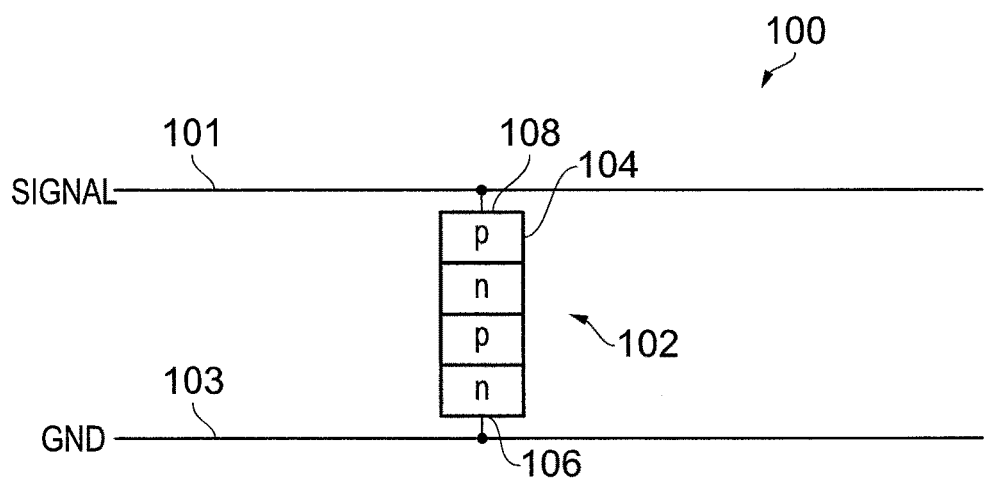
FIG. 1 illustrates a data transmission system with a first signal path.

An ESD protection device may be provided in a data transfer system in order to limit the maximum stress voltage that may be encountered by voltage sensitive components of the data transfer system to a tolerable level, such as a few volts. The switching times of ESD protection devices should ideally also be rapid enough to eliminate the risk of damage to the voltage sensitive components. It is therefore desirable to use components that provide relatively low voltage clamping and switching times in ESD protection devices for data transmission systems.

One example of an ESD device comprises a simple diode with a PN junction (such as a Zener diode or an avalanche diode) provided between a signal line and ground line of a signal transmission system. The simple diode is provided in a reverse biased configuration with respect to a data signal on the signal line so that a positive data signal is not rectified to ground. In this case, the use of the simple diode may result in a 5 pF capacitance on the signal line and a 25 V clamping voltage as measured using a 10 A transmission line pulse (TLP) test current.

In recent years, the data transfer rates that are required from data transmission systems have increased drastically. Consequently, modern data transmission systems have to fulfil the requirements of providing fast signal rise times and low signal-to-noise levels whilst operating at high frequencies. In practice, these requirements limit the capacitances that are permitted for electrostatic discharge (ESD) protection devices.

For modern systems, the clamping voltage of 25 V and 5 pF increase in line capacitance associated with a simple diode ESD protection device may result in an unacceptable limitation on the maximum data transmission rate of the system. The line capacitance and voltage clamping level of such a data transmission system may be improved by replacing the ESD protection device.

A rail-to-rail ESD protection device comprises a first diode between a signal line and a ground line and a second diode between the signal line and a voltage source. The first and second diodes provide separate current paths for the respective polarities of ESD current. By using different current paths for the two current polarities it may be possible to use diodes in forward-biased direction only. Such diodes may be referred to as "steering diodes" because they steer the ESD voltage away from the signal line. Power dissipation for a given current level is lower in a diode that is forward-biased than in a reverse-biased diode in breakdown. As a result of the reduction in power dissipation, a diode with lower power handling capability may be used which results in the line capacitance of the system may be reduced. Such an ESD protection device may result in a signal line capacitance of 1 pF and provide a clamping voltage of 25 V as measured using a 10 A TLP test current.

A high-capacitance, high-power clamping structure, such as a Zener diode or an open base transistor may be additionally provided between the two rails: 'signal' and 'ground'. In such examples, a stress pulse of one polarity is clamped by both a steering diode and the clamping structure, resulting in a relative high on-resistance and accordingly a high clamping voltage.

The clamping voltage of the rail-to-rail ESD protection device may be reduced by replacing the clamping structure (between the signal line and the ground line) with a silicon controlled rectifier (SCR), which is a type of thyristor. In such a device, the breakdown voltage may still be higher than a typical Vcc level, but when triggered the SCR switches to a low ohmic state that is similar to a forward-biased diode. The clamping voltage for positive current stress is the sum of the clamping voltage across a steering diode and across the SCR. Such an ESD protection device may result in a line capacitance of 0.5 pF and provide a clamping voltage of 10 V as measured using a 10 A TLP test current.

In a further development, a thyristor (SCR) may be used to replace one steering diode and the clamping structure. The SCR and the remaining steering diode are placed parallel to each other between the signal line and ground. Such an ESD protection device may result in a signal line capacitance of 0.3 pF and provide a clamping voltage of 10 V as measured using a 6 A TLP test current.

The examples described with reference to FIGS. 1 to 3 relate to a data transmission system comprising a Shockley diode having a cathode connected to a ground line and an anode connected to a signal line. In effect, the Shockley diode replaces the diode or thyristor of the examples described previously in order to provide a data transmission system with reduced line capacitance and/or voltage clamping.

A Shockley diode comprises three PN junctions provided in series. Each of the PN junctions can be individually configured to reduce the capacitance of the device. As a result of the properties of the junctions of the Shockley diode, a smaller capacitive load is achievable with the Shockley diode than with the SCR, in which the capacitance is determined by its inner PN junction and the two outer PN junctions of the SCR are shorted by base connections. The clamping voltage that is achievable using a Shockley diode may be comparable to, or even lower than, that achievable with a SCR.

Operating parameters such as forward voltage drop, switching time, and clamping voltage level of a modern Shockley diode are typically similar to those of a simple diode. One difference between the operational performance of a Shockley diode and a simple diode relates to switching behaviour from an isolating mode to a conducting mode. A Shockley diode may have a longer switching time than a simple diode because the two coupled transistors that form the Shockley diode may have to multiply a leakage current, which may be very small, until the leakage current reaches a limit for switching the Shockley diode to its low ohmic state.

There are a number of factors that would lead a person working in the field of electrostatic protection for data transmission systems away from using a Shockley diode as a conduction path for electrostatic discharge events as a routine design modification. These factors include that:

typically, semiconductor engineers aim to avoid leaving regions electrically floating and so the benefits and disadvantages of providing an electrically floating region in a particular application are not generally considered.

a simple diode performs a similar role to a Shockley diode (in that a simple diode performs a task of draining current in the forward direction with a voltage drop of 700-800 mV) whilst being less complex and simpler to build and design than a Shockley diode.

Shockley diodes are nonlinear devices; unexpected, and often unwanted, electrical effects can occur when the diodes are implemented in new types of circuit.

One particular nonlinear property of a Shockley diode that has surprisingly been found to lend itself to the present application in electrostatic discharge protection for data transmission systems is that at least some implementations of a forward-biased Shockley diode only behave like a forward-biased simple diode for applied DC signals; AC signals such as high-frequency data transmissions that do not exceed the breakdown voltage of the central PN junction of the Shockley diode are not rectified. This is described below with reference to FIG. 1.

FIG. 1 illustrates a data transmission system 100 comprising a signal line 101 and a ground line 103. A first signal path 102 is provided between the signal line 101 and the ground line 103. The first signal path 102 comprises a Shockley diode 104 having a cathode 106 and an anode 108. The cathode 106 is connected to the ground line 103 and the anode 108 is connected to the signal line 101. The Shockley diode 104 has a breakdown voltage that is higher than the level of the data signals on the signal line 101. Possible internal arrangements of the Shockley diode are described in relation to FIGS. 4 to 12 below.

Returning to FIG. 1, if a DC forward voltage (such as voltage from a current ramp) were to be applied to the signal path 102, the Shockley diode 104 would spontaneously trigger and switch from an isolating state (in which substantial current does not flow through the Shockley diode 104) to a low ohmic state (comparable to the low-ohmic forward voltage state of a simple diode). This transition in the state of the Shockley diode 104 is caused by a feedback loop of two transistors that form the Shockley diode (a PNP transistor adjacent to the anode 108 with a floating base and a NPN transistor adjacent to the cathode 106 with a floating base). These transistors multiply any small leakage current until the current reaches the limit for switching the Shockley diode to its low ohmic state.

The Shockley diode 104 is forward-biased for data signals on the signal line 101 because such signals are positive with respect to ground. However, the Shockley diode 104 remains in the isolating state if a data signal (which is an example of an AC signal) is applied. This surprising effect is caused by charge stored in the floating regions of the Shockley diode 104. Break-down conduction does not occur because the data signal is below the breakdown voltage selected for the Shockley diode 104. The stored charge provides a reverse-bias at an emitter-base junction of each of the transistors within the Shockley diode 104 and so prevents the transistors that form the Shockley diode 104 from conducting current through the Shockley diode 104.

Although the Shockley diode 104 does not trigger with an AC signal that is applied, it will trigger when an ESD pulse is applied. Triggering is caused by the ESD pulse surpassing a breakdown voltage of the Shockley diode 104 and can be assisted by strong displacement currents within the Shockley diode 104 caused by the fast rising stress pulse. The Shockley diode 104 will switch from isolation to conduction when a stress pulse with positive polarity is applied to signal line 101 with respect to the ground line 103.

Providing the Shockley diode 104 in the forward-biased configuration with respect to the data signal on the signal line 101 enables the Shockley diode 104 to have a larger current handling capability than would be the case if the Shockley diode 104 were reverse biased. Therefore the Shockley diode 104 will be less robust for stress pulses on the signal line that have negative polarity relative to ground.

For a protection scheme that offers protection against both polarity of ESD currents, the first path may be complemented with a second path as described below in relation to the examples of FIGS. 2 and 3.

Figure 2:
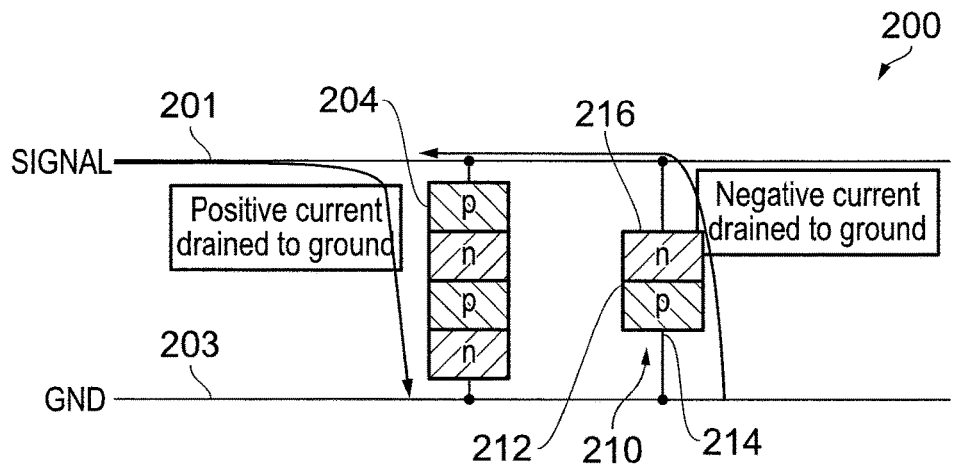
FIGS. 2 and 3 illustrate a data transmission system with first and second signal paths.

FIG. 2 illustrates another data transmission system 200 that is similar to that described with reference to FIG. 1 and further comprises a second signal path 210. Corresponding series of reference numerals are used to refer to similar features between the figures. The second signal path 210 comprises a diode 212 having an anode 214 and a cathode 216. The anode 214 is connected to the ground line 203 and the cathode 216 is connected to the signal line 201. That is, the diode 212 has the opposite polarity to the first path Shockley diode 204.

The first path Shockley diode 204 enables unwanted voltage/current, such as an ESD, of a single (positive) polarity on the signal line 201 to be drained to ground 203. The second path 210 enables the other polarity (negative) of high voltage pulses on the signal line 201 to pass to ground 203. The provision of the second path 210 may be advantageous in applications in which an ESD or EOS of either polarity can build up on the signal line 201.

Figure 3:
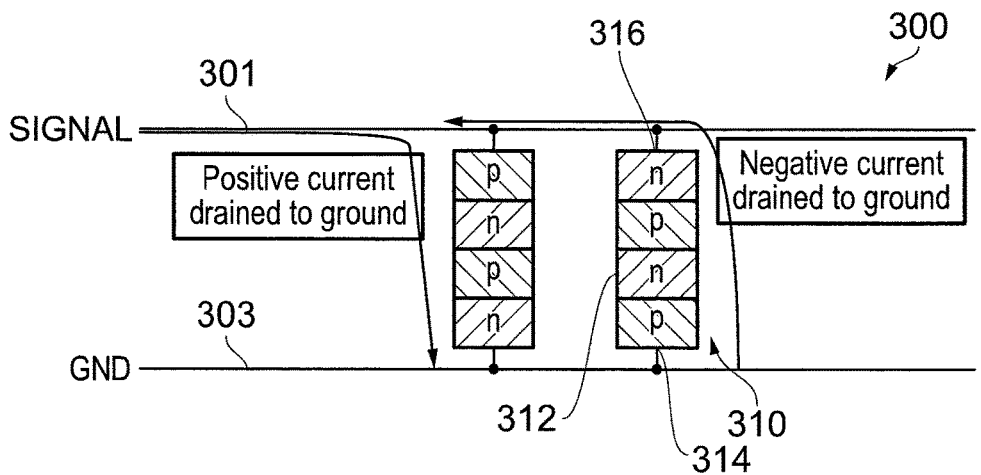

FIG. 3 illustrates another data transmission system 300 that is similar to that described with reference to FIG. 2 in which the second path 310 comprises a second path Shockley diode 312. The second path Shockley diode 312 has an anode 314 and a cathode 316. The anode 314 is connected to the ground line 303 and the cathode 316 is connected to the signal line 301. Use of a second path Shockley diode instead of the simple diode described with reference to FIG. 2 provides similar advantages to the use of the Shockley diode in the first path. That is, the use of a second path Shockley diode 312 may reduce the capacitance on the signal line 303, for example. Furthermore the use of the second path Shockley diode 312 makes it possible to transmit signals on the signal line 301 that can be negative relative to ground without rectifying the negative parts of the signal. For example, signals centered around ground may be transmitted using the data transmission system 300.

Figure 4:
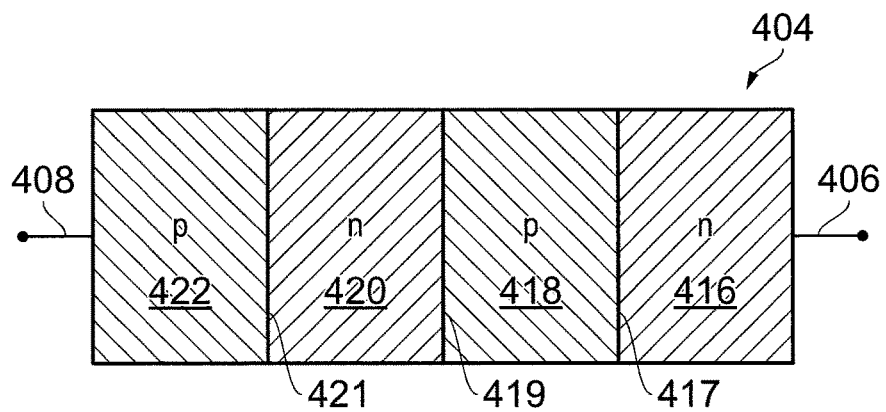
FIGS. 4 to 12 illustrate examples of Shockley diodes for use in the data transmission system of FIGS. 1 to 3.

FIG. 4 illustrates a Shockley diode 404 for use in the data transmission systems of FIGS. 1 to 3. The Shockley diode 404 has a cathode 406 and an anode 408. The Shockley diode 404 comprises an outer n-doped region 416, an inner p-doped region 418, an inner n-doped region 420 and an outer p-doped region 422. Each region 416-422 is provided as a layer between the anode 408 and the cathode 406.

The outer n-doped region 416 provides the cathode 406 and neighbours the inner p-doped region 418. The inner p-doped region 418 is provided between the outer n-doped region 416 and the inner n-doped region 420. The inner n-doped region 420 is provided between the inner p-doped region 418 and the outer p-doped region 422. The outer p-doped region 422 provides the anode 408 and neighbours the inner n-doped region 420. Each region that is said to be "between" another two regions is directly connected to its neighbouring regions. In this way, the doped regions 416-422 create three PN junctions. A first PN junction 417 is provided between the outer n-doped region 416 and the inner p-doped region 418. A second PN junction 419 is provided between the inner p-doped region 418 and the inner n-doped region 420. A third PN junction 421 is provided between the inner n-doped region 420 and the outer p-doped region 422.

In effect the Shockley diode 409 provides two transistors. A PNP transistor is provided by the outer p-doped region 422, the inner n-doped region 420 and the inner p-doped region 418. The inner n-doped region 420 provides a floating base of the PNP transistor. An NPN transistor is provided by the inner n-doped region 420, the inner p-doped region 418 and the outer n-doped region 416. The inner n-doped region 420 provides a floating base of the NPN transistor.

The Shockley diode 404 can be optimized for low capacitance, low on-resistance and fast turn-on by tailoring the properties of the PN junctions. Various examples of Shockley diodes with various junction structures are described below with reference to FIGS. 5 to 12.

The terms "low" and "high" doped regions or subregions, referred to below generally as (sub-)regions, are used herein in order to denote a relative difference in dopant concentrations within a device. Generally, a low doped (sub-)region has a lower dopant concentration than a corresponding high doped (sub-)region within a particular device. A high doped (sub-)region may be indicated by a "+" symbol, for example N+ or P+. A low doped (sub-)region may be indicated by a "−" symbol, for example N− or P−. For a particular example, an N (sub-)region may be substituted with a P (sub-)region and vice versa. One of an N-type region and a P-type region may be referred to as having a first conductivity type and the other may be referred to as having a second conductivity type.

A high doped (sub-)region may have a dopant concentration greater than $3 \times 10^{15}$ cm$^3$ or greater than $1 \times 10^{16}$ cm$^3$, for example.

A doping level of a low doped (sub-)region may be selected such that a particular diffusion voltage enables the entire (sub-)region to be depleted. A low doped (sub-)region may have a doping concentration greater than $1 \times 10^{12}$ cm$^3$ and/or less than $1 \times 10^{15}$ cm$^3$. For example, a low doped (sub-)region may have a doping concentration of between $1 \times 10^{14}$ cm$^3$ and $1 \times 10^{15}$ cm$^3$, for example. A low doped (sub-)region may have a thickness in the range of a micrometer, for example 1 μm to 3 μm.

The thickness of a low doped (sub-)region may be selected based on a trade-off between desired capacitance and switching speed; thicker low doped areas result in reduced capacitance but an increased switching time.

Figure 5:
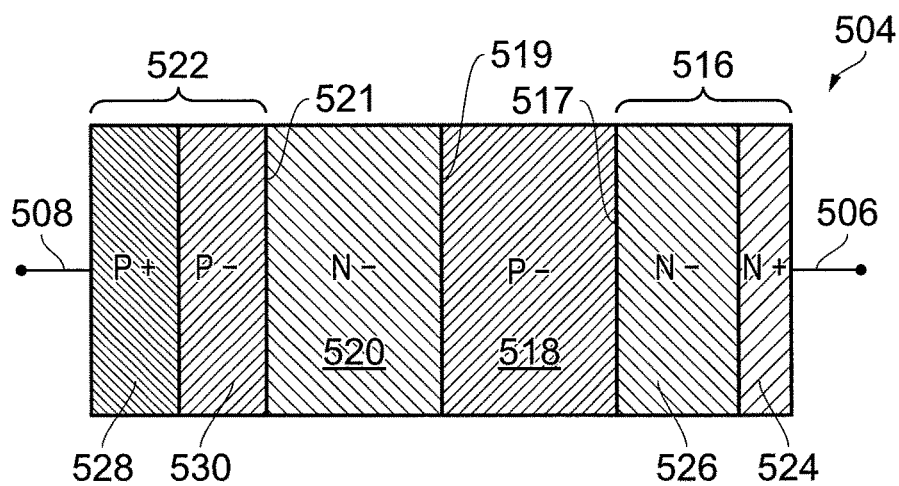

FIG. 5 illustrates a second example of a Shockley diode 504 for use in the data transmission systems of FIGS. 1 to 3. The Shockley diode 504 generally relates to the Shockley diode described with reference to FIG. 4. In this example the doping of the Shockley diode 504 is configured to reduce its capacitance.

The outer n-doped region 516 comprises a high doped subregion 524 and a low doped subregion 526. The high doped subregion 524 of the outer n-doped region 516 provides the cathode 506. The low doped subregion 526 of the outer n-doped region 516 neighbours the inner p-doped region 518. The inner p-doped region 518 has a low dopant concentration.

The outer p-doped region 522 comprises a high doped subregion 528 and a low doped subregion 530. The high doped subregion 528 of the outer p-doped region 522 provides the anode 508. The low doped subregion 530 of the outer p-doped region 522 neighbours the inner n-doped region 520. The inner n-doped region 520 has a low dopant concentration.

A first PN junction 517 is formed between the low n-doped region 526 of the outer n-doped region 516 and the inner (low) p-doped region 518. A second PN junction 519 is formed between the inner p-doped region 518 and the inner (low) n-doped region 520. A third PN junction 521 is formed between the low doped subregion 530 of the outer p-doped region 522 and the inner (low) n-doped region 520. In this example the first, second and third PN junctions 517, 519, 521 are all junctions between respective low doped (sub-)regions. Such an arrangement of the PN junctions 517, 519, 521 means that a space-charge region at each junction is thicker and as a result the capacitance of each junction is smaller.

Advantageously, the area of each PN junction 517, 519, 521 may also be minimised in order to reduce the capacitance of the Shockley diode 504. A trade-off in the optimal area of the PN junctions 517, 519, 521 is present between the robustness of the device for current handling and its capacitance.

Figure 6:
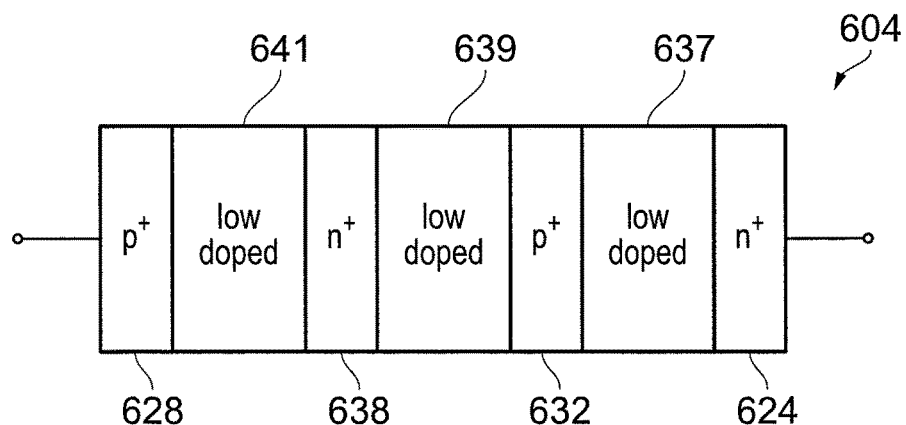

FIG. 6 illustrates an example of a Shockley diode 604 for use in the data transmission systems of FIGS. 1 to 3. The Shockley diode 604 generally relates to the Shockley diode described with reference to FIG. 4.

The outer n-doped region comprises a high doped subregion 624. The inner p-doped region comprises a high doped subregion 632. The inner n-doped region comprises a high doped subregion 638. The outer p-doped region comprises a high doped subregion 628. The Shockley diode 604 further comprises first, second and third low doped subregions 637, 639, 641.

The first low doped subregion 637 is provided between the high doped subregion 624 of the outer n-doped region and the high doped subregion 632 of the inner p-doped region. The first low doped subregion 637 may be a subregion of either of, or both of, the outer n-doped region and the inner p-doped region.

A first PN junction may be provided within the first low doped subregion 637. If the first low doped subregion 637 is a p-doped subregion then the first PN junction may be provided between the first low doped subregion 637 and the high doped subregion 624 of the outer n-doped region. If the first low doped subregion 637 is an n-doped subregion then the first PN junction may be provided between the first low doped subregion 637 and the high doped subregion 632 of the inner p-doped region.

The second low doped subregion 639 is provided between the high doped subregion 632 of the inner p-doped region and the high doped subregion 638 of the inner n-doped region. The second low doped subregion 639 may be a subregion of either of, or both of, the inner n-doped region and the inner p-doped region.

A second PN junction may be provided within the second low doped subregion 639. If the second low doped subregion 639 is a p-doped subregion then the second PN junction may be provided between the second low doped subregion 639 and the high doped subregion 638 of the inner n-doped region. If the second low doped subregion 639 is an n-doped subregion then the second PN junction may be provided between the second low doped subregion 639 and the high doped subregion 632 of the inner p-doped region.

The third low doped subregion 641 is provided between the high doped subregion 638 of the inner n-doped region and the high doped subregion 628 of the outer p-doped region. The third low doped subregion 641 may be a subregion of either of, or both of, the inner n-doped region and the outer p-doped region.

A third PN junction may be provided within the third low doped subregion 641. If the third low doped subregion 641 is a p-doped subregion then the third PN junction may be provided between the third low doped subregion 641 and the high doped subregion 638 of the inner n-doped region. If the third low doped subregion 641 is an n-doped subregion then the third PN junction may be provided between the third low doped subregion 641 and the high doped subregion 628 of the outer p-doped region.

In order to reduce or minimise the capacitance of the Shockley diode 604, one or more of the first, second and third low doped subregions 637, 639, 641 may be depleted by the diffusion voltage of the PN-junctions embedded in these regions.

One or more high doped (sub-)regions (such as the high doped subregion 638 of the inner n-doped region and the high doped subregion 632 of the inner p-doped region) can be included within a Shockley diode in order to safeguard against punch-through, which might cause excessive leakage current. The one or more high doped (sub-)regions should be high doped enough not to get fully depleted when an internal bias corresponding to the data signal is applied. Advantageously, the area of each PN junction within the Shockley diode 604 may also be minimised in order to reduce the capacitance of the Shockley diode 604. A trade-off in the optimal area of the PN junctions is present between the robustness of the device for current handling and its capacitance.

Figure 7:
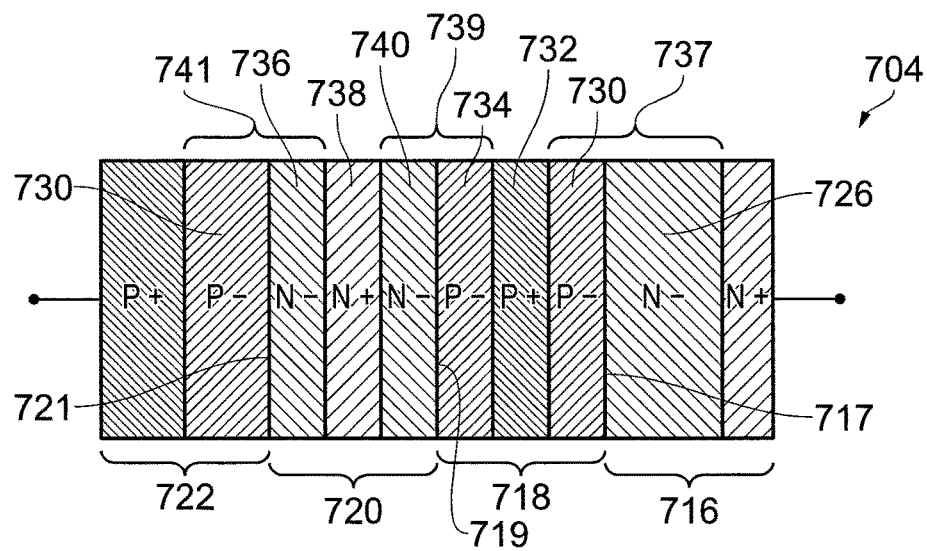

FIG. 7 illustrates a Shockley diode 704 that corresponds to the example discussed with reference to FIG. 6. The outer n-doped region 716 and the outer p-doped region 722 are arranged in the same way as in the Shockley diode described with reference to FIG. 5.

In this example, the PN junctions are provided by low doped (sub-)regions as in FIG. 5 and high doping regions are provided separate from, and between, the PN junctions in order to prevent or reduce the likely hood of punch through.

The inner p-doped region 718 has a first low doped subregion 730, a second low doped subregion 734 and a high doped subregion 732. The high doped subregion 732 of the inner p-doped region 718 is provided between the first and second low doped subregions 730, 734 of the inner p-doped region 718. The first low doped subregion 730 of the inner p-doped region 718 neighbours the outer n-doped region 716. The second low doped subregion 734 of the inner p-doped region 718 neighbours the inner n-doped region 720.

The inner n-doped region 720 has a first low doped subregion 736, a second low doped subregion 740 and a high doped subregion 738. The high doped subregion 738 of the inner n-doped region 720 is provided between the first and second low doped subregions 736, 740 of the inner n-doped region 720. The first low doped subregion 736 of the inner n-doped region 720 neighbours the outer p-doped region 722. The second low doped subregion 740 neighbours the inner p-doped region 718.

In this example, first, second and third low doped regions 737, 739, 741 provide respective first, second and third PN junctions 717, 719, 721 of the Shockley diode 704.

The first low doped region 737 comprises a low doped subregion 726 of the outer n-doped region 716 and the first low doped subregion 730 of the inner p-doped region 718. The first PN junction 717 is provided between the low doped subregion 726 of the outer n-doped region 716 and the first low doped subregion 730 of the inner p-doped region 718.

The second low doped region 739 comprises the second low doped subregion 740 of the inner p-doped region 718 and the second low doped subregion 740 of the inner n-doped region 720. The second PN junction 719 is provided between the second low doped subregion 740 of the inner p-doped region 718 and the second low doped subregion 740 of the inner n-doped region 720.

The third low doped region 741 comprises the first low doped subregion 736 of the inner n-doped region 720 and a low doped subregion 730 of the outer p-doped region 722. The third PN junction 721 is provided between the first low doped subregion 736 of the inner n-doped region 720 and a low doped subregion 730 of the outer p-doped region 722.

The provision of the high doped subregion 738 of the inner n-doped region 720 and the high doped subregion 732 of the inner p-doped region 718 provide protection against punch-through without affecting the performance of the first, second and third PN junctions 717, 719, 721 which are all provided by low doped subregions.

Advantageously, the doping of the high doped subregion 738 of the inner n-doped region 720 and the high doped subregion 732 of the inner p-doped region 718 should be minimised in order not to degrade the transistor gain of the PNP and NPN transistors that form the Shockley diode 704. If these high doped subregion 732, 738 were provided as too thick or too highly doped regions then the performance of the Shockley diode may be impaired. A minimal doped concentration per unit area for the N+ or P+ high doped regions can be about $3 \times 10^{11}$ cm$^{-2}$ (calculated for a 10 Volt bias—when described as charge per unit area). This concentration per unit area is independent of the thickness of the high doped (sub-)regions. This concentration per unit area equates to a dopant concentration per unit volume of $3 \times 10^{15}$ cm$^{-3}$ for a 1 μm thick high dopant (sub-)region.

The breakdown voltage of the second PN junction 719 may be relatively high in examples in which the second PN junction 719 is optimized for providing low capacitance. Advantageously, a small trigger diode, or other trigger element with tailored breakdown voltage, may be placed in parallel with the second PN junction 719. In such examples, a relatively small capacitance and a relatively small breakdown voltage may be achieved simultaneously.

Figure 8:
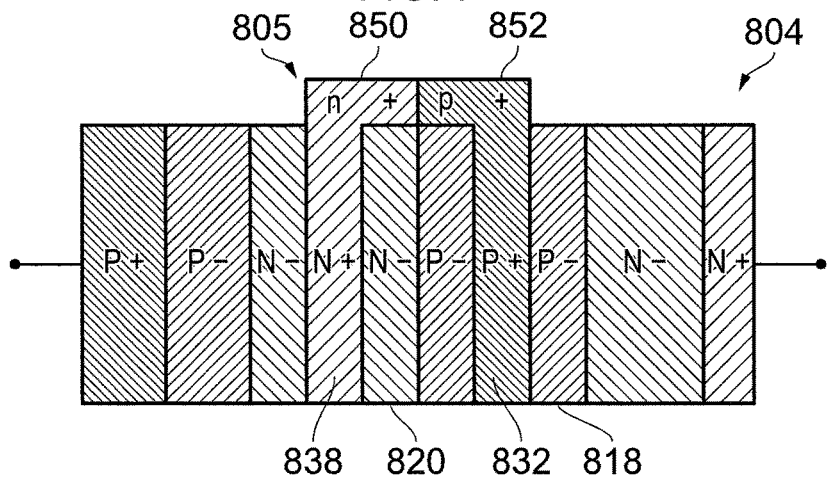

FIG. 8 illustrates another example of a Shockley diode 804 for use in the data transmission systems of FIGS. 1 to 3. The Shockley diode 804 comprises the Shockley diode described with reference to FIG. 7 and a bypass diode 805, which is an example of a trigger element. In this example, the bypass diode 805 is integrated with the Shockley diode 804. That is, the bypass diode 805 and the Shockley diode 804 are provided by a unitary component.

The bypass diode 805 comprises an anode 850 and a cathode 852. A PN junction is provided between the anode 850 and the cathode 852. The anode 850 is provided by an extension of the high doped subregion 838 of the inner n-doped region 820. The cathode 852 is provided by an extension of high doped subregion 832 of the inner p-doped region 818.

Alternatively, a diode, such as an avalanche diode, or other trigger element may be provided by doped regions that are separate from the doped regions of the Shockley diode. In such examples the trigger element may have a first terminal and a second terminal. The first terminal may be connected to the high doped subregion 838 of the inner n-doped region 820. The second terminal may be connected to the high doped subregion 832 of the inner p-doped region 818.

As an alternative to the example illustrated in FIG. 6, the second low doped region 639 may be omitted. In this alternative, the high doped subregion 632 of the inner p-doped region forms a second PN junction with the high doped subregion 638 of the inner n-doped region. An example of a Shockley diode with this alternative structure is described below with reference to FIG. 9.

Figure 9:
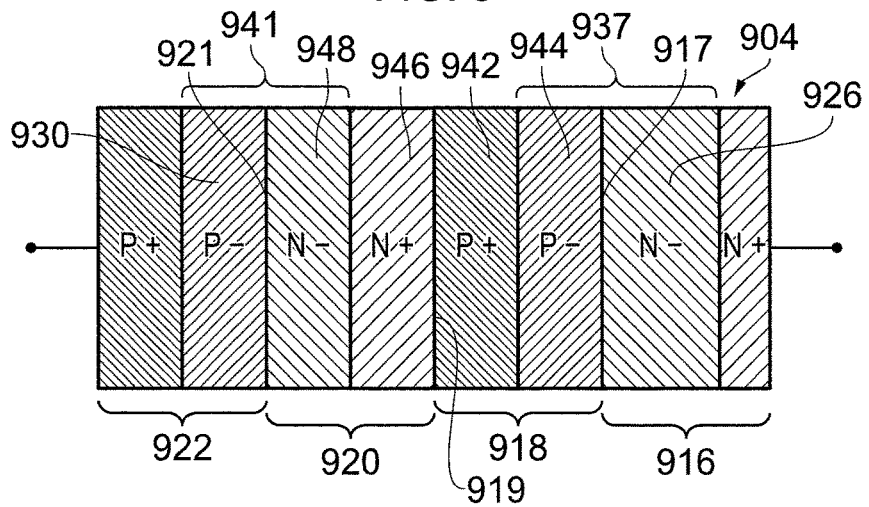

FIG. 9 illustrates another example of a Shockley diode 904 for use in the data transmission systems of FIGS. 1 to 3. An outer n-doped region 916 and an outer p-doped region 922 are arranged in the same way as the corresponding regions of the Shockley diode described with reference to FIG. 5.

An inner p-doped region 918 comprises a high doped subregion 942 and a low doped subregion 944. A first low doped region 937 comprises the low doped subregion 944 of the inner p-doped region 918 and a neighbouring low doped subregion 926 of the outer n-doped region 916. A first PN junction 917 is provided in the first low doped region 937 by the low doped subregion 944 of the inner p-doped region 918 and the low doped subregion 926 of the outer n-doped region 916.

An inner n-doped region 920 comprises a high doped subregion 946 and a low doped subregion 948. A second low doped region 941 comprises the low doped subregion 948 of the inner n-doped region 920 and a neighbouring low doped subregion 921 of the outer p-doped region 922. The high doped subregion 946 of the inner n-doped region 920 neighbours the high doped subregion 942 of the inner p-doped region 918. A second PN junction 919 is provided between the high doped subregion 946 of the inner n-doped region 920 and the high doped subregion 942 of the inner p-doped region 918. A third PN junction 921 is provided in the second low doped region 941 between the low doped subregion 948 of the inner n-doped region 920 and a low doped subregion 930 of the outer p-doped region 922.

The first and third PN junctions 917, 921 are provided by low doped subregions as in FIG. 5. The second PN junction 919 is provided by high doped subregions in order to further prevent or reduce the likelihood of punch through.

The breakdown voltage of the central, second PN junction 919 may be tailored to the target application of the Shockley diode 904. If the second PN junction 919 is not optimized for low capacitance then the whole junction can be tailored for a targeted breakdown voltage.

Any of the Shockley diodes described herein may be manufactured by forming a series of layers in a substrate using conventional methods such as surface diffusion, epitaxial layer growth, trench etching, metal deposition, wafer soaring and packaging for example.

Figure 10A:
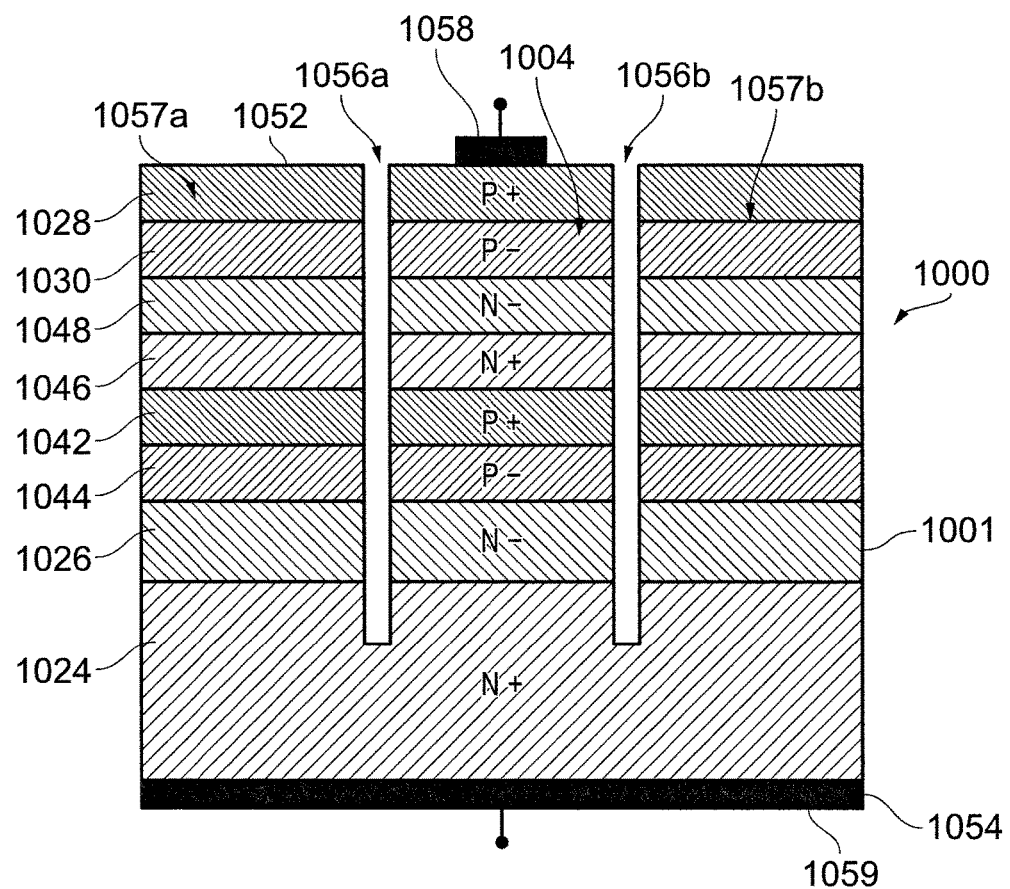
Figure 10B:
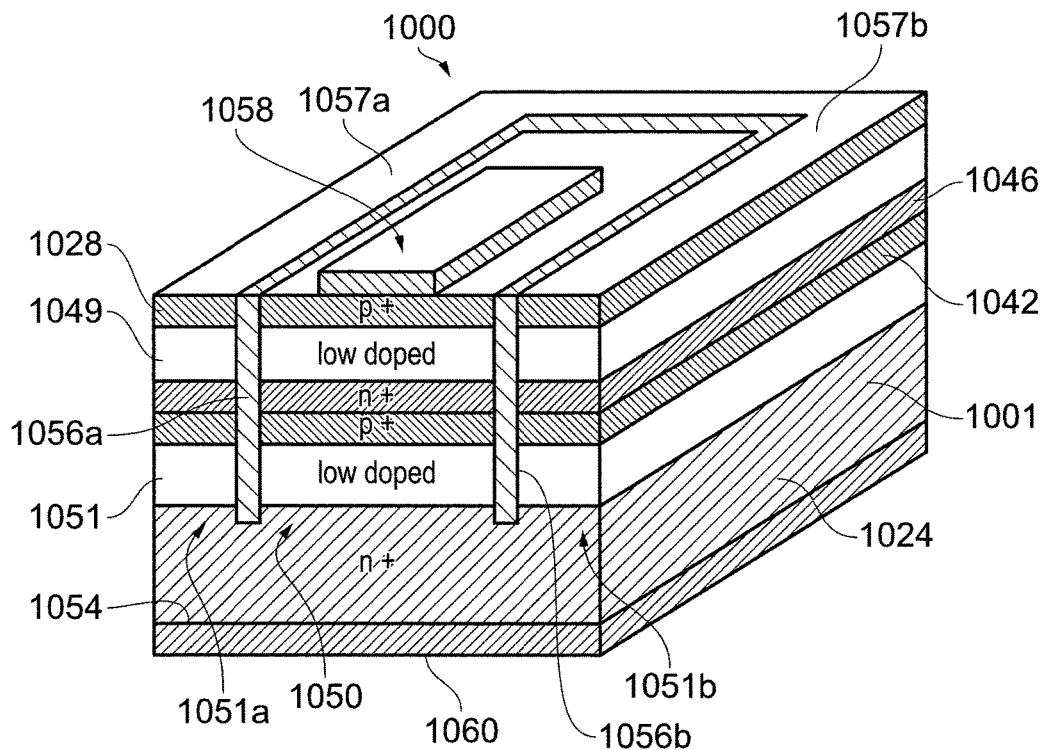
Figure 10C:
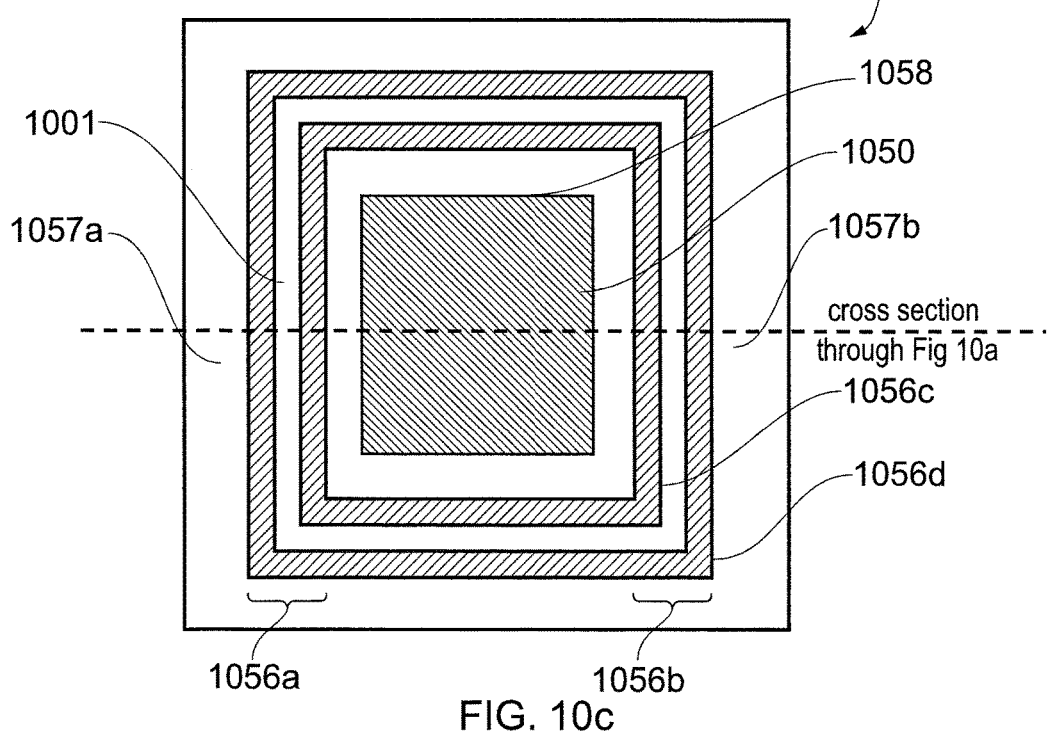

FIGS. 10a and 10b illustrate schematic cross sections of a vertical device 1000 comprising a Shockley diode 1004 such as that described with regard to FIG. 7. A top view of the vertical device 1000 is illustrated in FIG. 10c. The position of the cross section of FIG. 10a is illustrated by a dotted line in FIG. 10c. The vertical device 1000 has a substrate 1001 with a first surface 1052 and a second surface 1054. The substrate 1001 is planar and the first surface 1052 is on an opposite side of the substrate 1001 to the second surface 1054.

As illustrated in FIG. 10a, the substrate 1001 comprises a plurality of doped layers 1028, 1030, 1048, 1046, 1042, 1044, 1026, 1024 provided in series between the first and second surfaces 1052, 1054. The layers 1024-1048 correspond to the subregions described with regard to FIG. 7 (and FIG. 5) have been given corresponding reference numbers in the 1000 series. The layers 1024-1048 and may be formed by sequentially diffusing different dopant species to various depths in the substrate 1001 from the first surface 1052.

FIG. 10a also illustrates a low doped region 1030 of an outer p-doped region, a low doped region 1048 of an adjacent inner n-doped region, a low doped region 1044 of the inner p-doped region and a low doped region 1026 of the adjacent outer n-doped region. An alternative illustration of these regions is provided in FIG. 10b in which: (i) a low doped region 1030 of the outer p-doped region and the low doped region 1048 of the adjacent inner n-doped region are presented as a single first low doped region 1049; and (ii) a low doped region 1044 of the inner p-doped region and a low doped region 1026 of the adjacent outer n-doped region are presented as a single second low doped region 1051. As an alternative to the arrangement shown in FIG. 10a, the first or second low doped regions 1049, 1051 may each comprise only an n-doped region or only a p-doped region.

In both FIGS. 10a and 10b, the layers 1024-1048 extend across the plane of the substrate 1001 and have respective thicknesses between the first surface 1052 and the second surface 1054. Trenches 1056a, 1056b extend into the substrate 1001 from the first surface 1052 in order to divide the layers 1024-1048 and so form the Shockley diode 1004 between the trenches 1056a, 1056b, and also form surrounding regions 1057a, 1057b outside of the trenches 1056a, 1056b. The surrounding regions 1057a, 1057b are separated by the trenches 1056a, 1056b. Additional Shockley diodes may be provided in the surrounding regions 1057a, 1057b. The trenches 1056a, 1056b surround an active area of the Shockley diode 1004; the trenches 1056a, 1056b define the area of the PN junctions and isolate the active area from the surrounding silicon.

As illustrated in FIG. 10b, the trenches 1056a, 1056b extend into, but not through, the substrate and terminate in a high doped subregion 1024 of the outer n-doped region of the Shockley diode 1004, which provides an anode for the Shockley diodes 1004 adjacent to the second surface. An anode contact 1058 is provided on the first surface 1052 in order to provide an electrical connection to the Shockley diode 1004. A cathode contact 1059 is provided on the second surface 1054 in order to provide an electrical connection to the cathode of the Shockley diode 1004.

As illustrated in FIG. 10c, each trench 1056a, 1056b may be provided by multiple separate trenches 1056c, 1056d in order to reduce parasitic capacitance within the Shockley diode 1004. In FIG. 10c, each trench 1056a, 1056b comprises an inner trench 1056c adjacent to the Shockley diode 1004 and an outer trench 1056d adjacent to the surrounding regions 1057a, 1057b. The outer trench 1056d is separated from the inner trench 1056c by a portion of the substrate 1001. The anode contact 1058 is separated from the inner trench 1056c. In this example, the anode contact 1058 is equidistant from all portions of the inner trench 1056c.

Any Shockley diode described herein may be provided as a vertical device using an arrangement similar to that illustrated in FIG. 10.

Figure 11A:
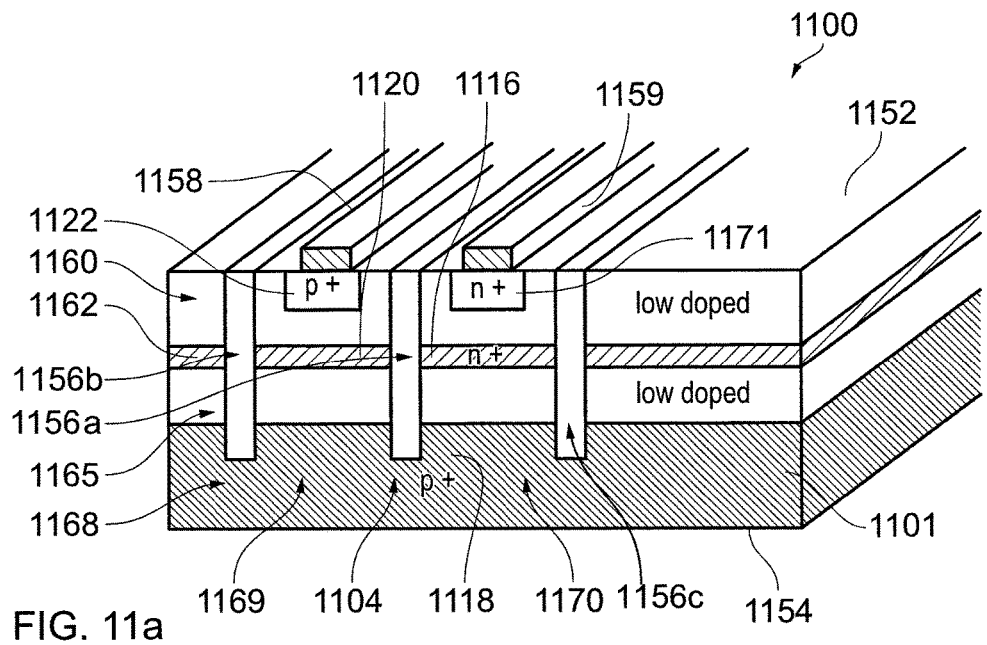

FIG. 11a illustrates a schematic cross section of another vertical device 1100 comprising a Shockley diode 1104.

The vertical device 1100 has a substrate 1101 with a first surface 1152 and a second surface 1154. The substrate 1101 is planar and the first surface 1152 is on an opposite side of the substrate 1101 to the second surface 1154. The substrate 1101 comprises a plurality of doped layers 1160-1168.

The doped layers 1160-1168 comprise a low n-doped layer 1160, a high n-doped layer 1162, a low doped layer 1165, and a high p-doped layer 1168 provided in series, in that order, from the first surface 1152 to the second surface 1154. The low doped layer 1165 may be a p-doped layer or an n-doped layer.

The layers 1160-1168 extend across a plane of the substrate 1101 (at least in the confines of the Shockley diode 1104) and have respective thicknesses between the first surface 1152 and the second surface 1154. An internal trench 1156a extends into the substrate 1101 from the first surface 1152 in order to divide the plurality of doped layers and so form a Shockley diode 1104 with a first portion 1169 on one side of the trench internal 1156a and a second portion 1170 on an opposing side of the internal trench 1156a.

Trenches 1056b, 1056c surround an active area of the Shockley diode 1004. The trenches 1056b, 1056c isolate the active area from the surrounding silicon. The trenches 1056b, 1056c, together with the internal trench 1056a, define the area of the PN junctions.

In the first portion 1169 of the Shockley diode 1104, an outer p-doped region 1122 is diffused into the first surface and forms a first PN junction with the first low n-doped layer 1160. The outer p-doped region 1122 has a high dopant concentration.

An inner n-doped region 1120 comprises the first low n-doped layer 1160 and the high n-doped layer 1162 in the first portion 1169 of the Shockley diode 1104. If the low doped layer 1165 is provided by an n-doped layer, the low doped layer 1165 in the first portion 1169 is also part of the inner n-doped region 1120.

An inner p-doped region 1118 comprises the high p-doped layer 1169. If the low doped layer 1165 is provided by a p-doped layer, the low doped layer 1165 is also part of the inner p-doped region 1118.

A high n-doped subregion 1171 is diffused into the first low doped layer 1160 at the first surface 1152 of the second portion 1170. An outer n-doped region 1116 is provided by the high n-doped subregion 1171, the first low doped layer 1160, the high n-doped layer 1162 and the second low n-doped layer 1064 in the second portion 1170 of the Shockley diode 1104.

An anode contact 1158 is provided on the outer p-doped region 1122 at the first surface 1152 of the first portion 1169 in order to provide an electrical connection to the Shockley diode 1104. A cathode contact 1159 is provided on the high n-doped subregion 1171 at the first surface 1152 of the second portion 1170 in order to provide an electrical connection to the Shockley diode 1104.

Figure 11B:
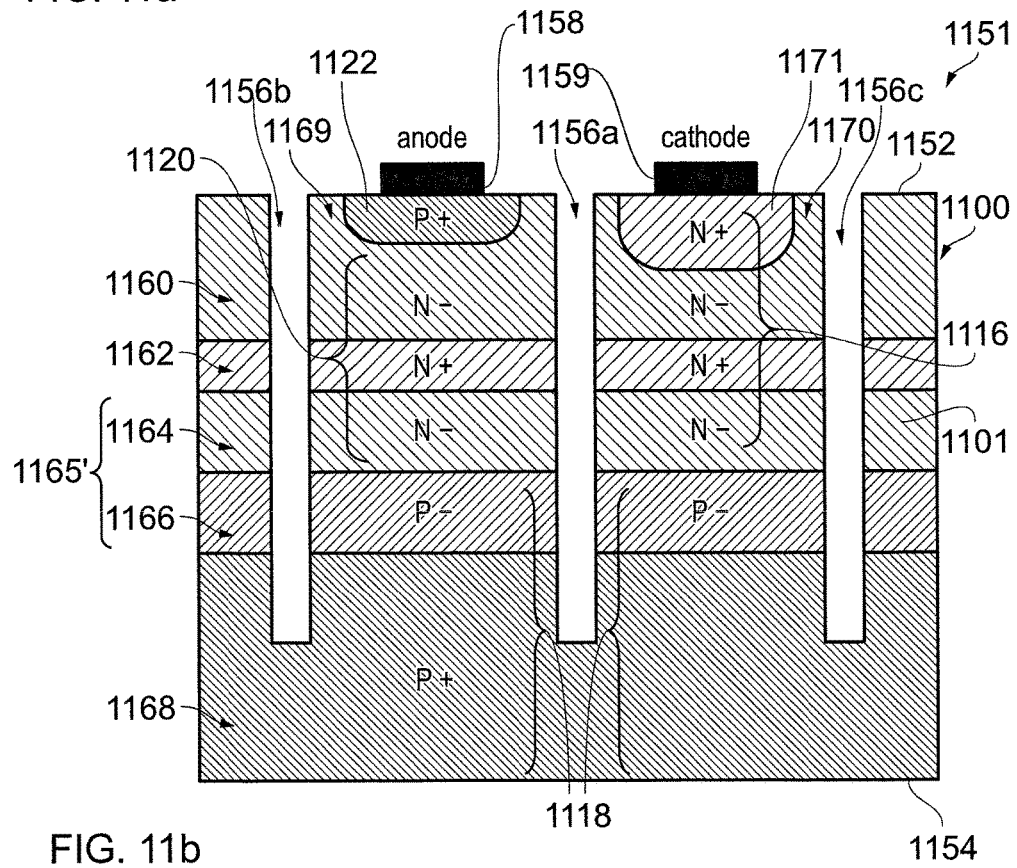

FIG. 11b illustrates a schematic cross section of another vertical device 1151 comprising a Shockley diode. The Shockley diode is an example of the diode described with reference to FIG. 11a. In this example, a low doped layer 1165', which relates to the low doped layer in FIG. 11a, comprises a second low n-doped layer 1164 and a first low p-doped layer 1166. The second low n-doped layer 1164 and the first low p-doped layer 1166 form a PN junction.

The second low n-doped layer 1164 in the first portion 1169 of the Shockley diode 1151 is part of the inner n-doped region 1120. The second low n-doped layer 1164 in the second portion 1170 of the Shockley diode 1151 is part of the outer n-doped region 1116. The second low n-doped layer 1164 is disposed between the high n-doped region 1162 and the low p-doped region 1166.

The first low p-doped layer 1166 in the first and second portions 1169, 1170 of the Shockley diode 1151 are part of the inner p-doped region 1118. The first low p-doped layer 1166 is disposed between the second low n-doped layer 1164 and the high p-doped layer 1168.

In an alternative example, there may be provided a low p-doped layer instead of the low n-doped layer 1160.

FIG. 11c illustrates a top view of the vertical device 1100. The position of the cross section of FIG. 11a is illustrated by a dotted line in FIG. 11c. Each trench 1156a, 1156b, 1156c may be provided by multiple, separate sub-trenches 1156d, 1156e in order to reduce parasitic capacitance within the Shockley diode 1004. Each trench 1156a, 1156b, 1156c comprises an inner trench 1156d adjacent to the Shockley diode 1104 and an outer trench 1156e adjacent to surrounding regions 1057a, 1057b. The outer trench 1056d is separated from the inner trenches 1056c by a portion of the substrate 1001.

Figure 12:
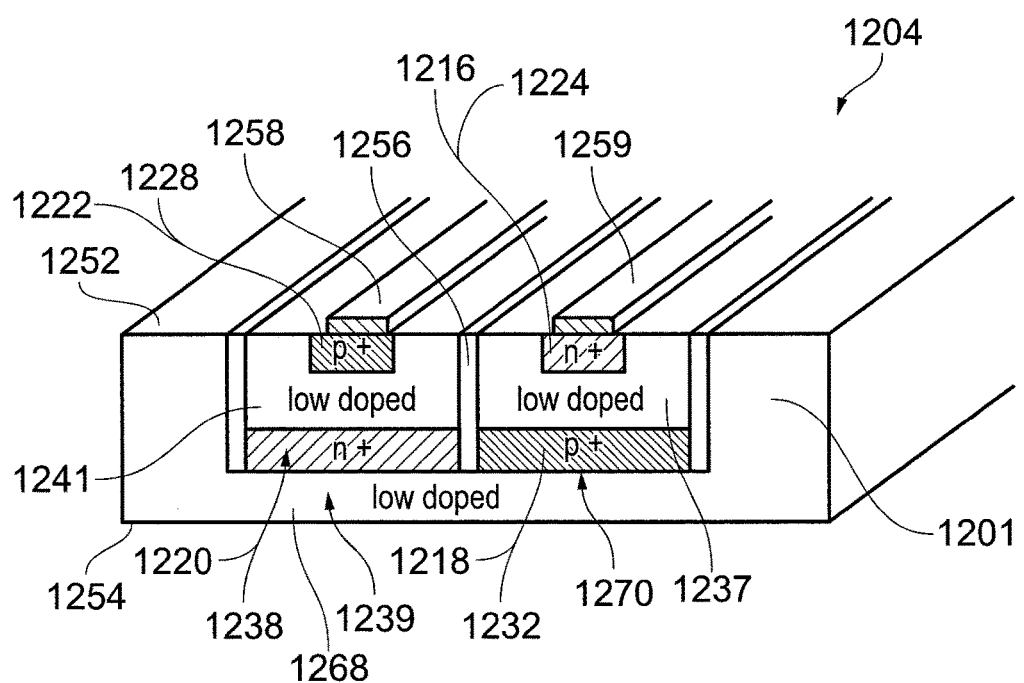

FIG. 12 illustrates a schematic cross section of another vertical device comprising a Shockley diode 1204. The Shockley diode 1204 relates to the diode described with reference to FIG. 6 and comprises first, second and third low doped subregions 1237, 1239, 1241.

The vertical device has a substrate 1201 with a first surface 1252 and a second surface 1254. The substrate 1201 is planar and the first surface 1252 is on an opposite side of the substrate 1201 to the second surface 1254. A number of regions are provided in the substrate in order to provide the Shockley diode 1204. An internal trench 1256 extends into the substrate 1201 from the first surface 1252 towards the second surface 1254 in order to form a first portion 1269 of the Shockley diode 1204 on one side of the internal trench 1256 and a second portion 1270 of the Shockley diode 1204 on an opposing side of the internal trench 1256. The second low doped subregion 1239 is provided as a layer adjacent to the second surface and extends across both of the first portion 1269 and the second portion 1270 of the Shockley diode 1204.

The first portion 1262 of the Shockley diode 1204 comprises the following regions arranged in series, in the order stated, between the first and second surfaces 1252, 1254:

an outer p-doped region 1222 comprises a high doped subregion 1228;
the first low doped region 1241;
a high doped subregion 1238 of an inner n-doped region 1220; and
second low doped subregion 1239 within the first portion 1269.

The second portion 1270 of the Shockley diode 1204 comprises the following regions arranged in the order stated, between the first and second surfaces 1252, 1254:

an outer n-doped region 1216 comprising a high doped subregion 1224;
the third low doped subregion 1237;

an inner p-doped region 1218 comprising a high doped subregion 1232; and
the second low doped subregion 1239 within the second portion 1270.

An anode contact 1258 is provided on the outer p-doped region 1222 at the first surface 1252 of the first portion 1269 in order to provide an electrical connection to the Shockley diode 1204. A cathode contact 1259 is provided on the high n-doped subregion 1271 at the first surface 1252 of the second portion 1270 in order to provide an electrical connection to the Shockley diode 1204.

A top view of the Shockley diode 1204 is similar to that illustrated with reference to the Shockley diode in FIG. 11c.

It will be appreciated that any components or (sub-) regions that are described herein as being coupled or connected could be directly or indirectly coupled or connected unless the context of the example dictates otherwise. That is, one or more components could be located between two components that are said to be coupled or connected whilst still enabling the required functionality to be achieved.

Throughout the present specification, descriptors relating to relative orientation and position, such as "top", "bottom", "upper", "lower", "above" and "below", as well as any adjective and adverb derivatives thereof, are used in the sense of the orientation of the apparatus as presented in the drawings. However, such descriptors are not intended to be in any way limiting to an intended use of the described or claimed apparatus.

The invention claimed is:

1. A data transmission system comprising:
a signal line for carrying a data signal;
a ground line for connecting to ground; and
a first path Shockley diode having a cathode and an anode, wherein the cathode is connected to the ground line and the anode is connected to the signal line, wherein the first path Shockley diode comprises an outer p-doped region, an inner n-doped region, an inner p-doped region, an outer n-doped region, wherein the outer p-doped region and the inner n-doped region form a first PN junction, wherein the inner n-doped region and the inner p-doped region form a second PN junction and wherein the inner p-doped region and the outer n-doped region form a third PN junction, wherein one or more of the regions of the first path Shockley diode comprises a first doped subregion and a second doped subregion, wherein the first doped subregion has a higher dopant concentration than the second doped subregion, wherein the inner p-doped region comprises a first doped subregion, a second doped subregion and a third doped subregion, wherein the first doped subregion is provided between, and has a higher dopant concentration than, the second and third doped subregions of the inner p-doped region, wherein the inner n-doped region comprises a first doped subregion, a second doped subregion and a third doped subregion, and wherein the first doped subregion is provided between, and has a higher dopant concentration than, the second and third doped subregions of the inner n-doped region.

2. The data transmission system of claim 1, comprising a bypass trigger element, the bypass trigger element comprising:
a first terminal connected to the first doped subregion of the inner p-doped region of the Shockley diode; and
a second terminal connected to the first doped subregion of the inner n-doped region of the Shockley diode.

3. The data transmission system of claim 2, wherein the bypass trigger element is integrated with the first path Shockley diode.

4. The data transmission of claim 1, wherein each first doped subregion has a dopant concentration greater than $1 \times 10^{15}$ cm$^{-3}$.

5. The data transmission system of claim 1, wherein each second doped subregion has a dopant concentration lower than $1 \times 10^{15}$ cm$^{-3}$.

6. The data transmission system of claim 1, wherein the first path Shockley diode comprises one or more contacts, each contact disposed within 4 microns of one of the PN junctions.

7. The data transmission system of claim 1, wherein the Shockley diode is a vertical semiconductor device.

* * * * *